United States Patent [19]
Nagata et al.

[11] Patent Number: 4,653,028
[45] Date of Patent: Mar. 24, 1987

[54] RADIO PAGING RECEIVER

[75] Inventors: Koichi Nagata; Takeshi Nakajima, both of Tokyo, Japan

[73] Assignee: NEC Corporation, Tokyo, Japan

[21] Appl. No.: 488,875

[22] Filed: Apr. 26, 1983

[30] Foreign Application Priority Data
Apr. 26, 1982 [JP] Japan .................................. 57-70918

[51] Int. Cl.⁴ ............................................. G11C 11/00
[52] U.S. Cl. ................................ 365/195; 340/825.44
[58] Field of Search ............... 365/154, 155, 156, 195; 179/2 EC, 18 BF; 340/311.1, 825.44, 825.48

[56] References Cited
U.S. PATENT DOCUMENTS
4,477,807 10/1984 Nakajima et al. ............. 340/825.44

Primary Examiner—James W. Moffitt
Attorney, Agent, or Firm—Sughrue, Mion, Zinn, Macpeak, and Seas

[57] ABSTRACT

A calling signal memory device for a radio paging receiver includes n·x memory cells which are arranged in n lines and x columns to constitute shift registers in the line direction and flipflops in the column direction. Each flipflop allows only one information to be stored in the memory cells in its associated column. Information stored in the respective columns is transferred from the associated input terminals to the associated output terminals to be thereby delivered sequentially in the first-in-first-out order.

3 Claims, 15 Drawing Figures

*Fig. 1*

PRIOR ART

RADIO PAGING RECEIVER

BACKGROUND OF THE INVENTION

The present invention relates to a memory circuit for storing time-serially input signals and, more particularly, to a calling number memory circuit for a radio paging receiver to which a plurality of different selective calling numbers are assigned.

The number of selective calling numbers heretofore assigned to a radio paging receiver is usually not more than two and, for this reason, a calling signal memory circuit of the receiver is constructed to simply memorize whether or not a call was received. A current trend in the art of radio paging systems, however, is to the use of a larger number of selective calling numbers per receiver and a system assigning three or more selective calling numbers to a paging receiver has already been developed. Each receiver in such a radio paging system has to be furnished with a calling signal memory circuit which can even store the order of receipt of n (integer not smaller than 2) selective calling signals communicated to the receiver from the base station.

SUMMARY OF THE INVENTION

It is an object of the present invention is to provide a radio paging receiver having a memory device which is capable of storing detected calling signals, from the first to "n", individually received at different times and, in response to a request from the outside made at a desired time, delivers output data corresponding to the first to "n" detected signals in the first-in-first-out sequence, starting from the data associated with the first detected signal.

It is another object of the present invention to provide a generally improved radio paging receiver.

A memory device for a radio paging receiver embodying the present invention has n (integer not smaller than 2) input terminals and n output terminals individually corresponding to the input terminals and delivers input signals supplied to the input terminals sequentially from the output terminals. Memory means includes x (integer not smaller than 2) memory portions which are cascaded in x stages. Each of the memory portions has n input terminals, n output terminals and n data hold terminals in one-to-one correspondence. The output terminals of any of said stages are connected to the input terminals of the subsequent stage and the output terminals of the subsequent stage are connected to the data hold terminals of the preceding stage. Control means controls the memory means such that data is so transferred and output as to cause data in said preceding stage to be held when the subsequent stage is empty and be prevented from being held when the subsequent stage is full.

In accordance with the present invention, a calling signal memory device for a radio paging receiver includes n.x memory cells which are arranged in n lines and x columns to constitute shift registers in the line direction and flip-flops in the column direction. Each flip-flop allows only one information to be stored in the memory cells in its associated column. Information stored in the respective columns is transferred from input terminals to the associated output terminals to be thereby delivered sequentially in the first-in-first-out order.

The above and other objects, features and advantages of the present invention will become apparent from the following detailed description taken with the accompanying drawings.

DESCRIPTION OF THE PREFERRED EMBODIMENT

While the radio paging receiver of the present invention is susceptible of numerous physical embodiments, depending upon the environment and requirements of use, a substantial number of the herein shown and described embodiment have been made, tested and used, and all have performed in an eminently satisfactory manner.

To facilitate understanding of the present invention, a brief reference will be made to the calling signal memory circuit of a prior art paging receiver to which two calling numbers at the most are assigned, depicted in FIG. 1.

Figure 1:
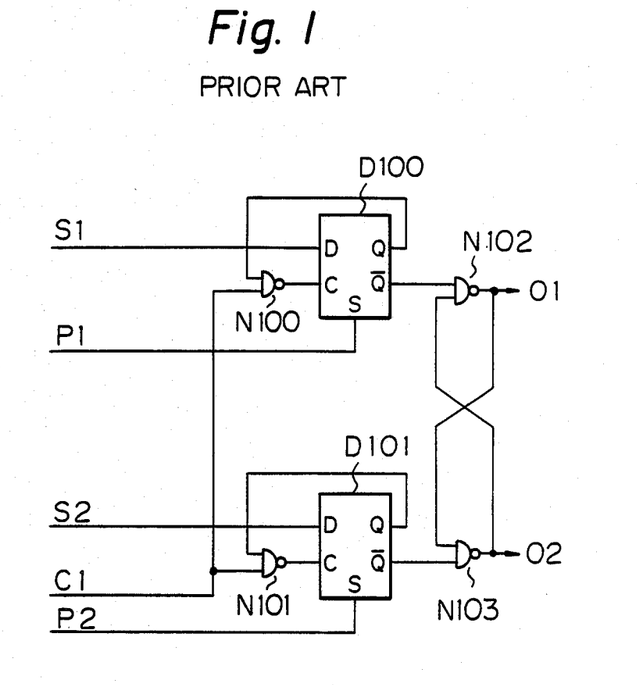
FIG. 1 is a diagram of a prior art memory circuit for a radio paging receiver.

The circuit shown in FIG. 1 comprises two-input NAND gates N100, N101, N102 and N103 and delay-type (D-type) flipflops D100 and D101 each having a set terminal. Signals $S_1$ and $S_2$ are respectively supplied to the flipflops D100 and D101 each indicating a result of comparison of a received signal with an address codeword assigned to the receiver. Each signal $S_1$ or $S_2$ is low level under the initial set condition and will become and remain high level once inconsistency is found in any signal bit by the comparison. A clock signal $C_1$ is supplied timed to the last bit of the address codeword in order to load the flipflops D100 and D101 with the data represented by the signals $S_1$ and $S_2$ respectively. A positive pulse signal $P_1$ is supplied to the flipflop D100 and a positive pulse signal $P_2$ to the flipflop D101, each for initializing the flipflop when the power sourse is turned on as well as for resetting the same. Output signals $O_1$ and $O_2$ correspond to the respective address codewords and are used to emit an alert tone under their low levels.

The operation of the memory circuit will be outlined. As the power source is turned on, the signals $P_1$ and $P_2$ individually set the flipflops D100 and D101 $\bar{Q}$ outputs of which then commonly become low level. This makes the outputs of the NAND gates N102 and N103 high level to disenable the alert. Q outputs of the flipflops D100 and D101 are high level maintaining their associated NAND gates N100 and N101 enabled.

When the data represented by the signal $S_1$ is loaded in the flipflop D100 by the clock signal $C_1$ while the signal $S_1$ is low level, $\bar{Q}$ output of the flipflop D100 turns into high level to in turn make the signal $O_1$ low level and thereby triggers the alert for notifying the receipt of a call. While Q output of the flipflop D100 remains low level, the NAND gate N100 is disenabled so that the above-mentioned situation is maintained until cancelled by the signal $P_1$. Likewise, when the data represented by the signal $S_2$ is loaded in the flipflop D101 by the clock signal $C_1$ while the signal $S_2$ is low level, Q output of the flipflop D101 becomes low level to disenable the gate N101 and remains at this level until set by the signal $P_2$. Even if the $\overline{Q}$ output of the flipflop D101 is made high level, the output of the NAND gate N103 is kept at the high level due to the low level output of the NAND gate N102. An arrangement is made such that set signals $P_1$ and $P_2$ are supplied to the set terminals of D100 and D101 in synchronization with the reset of the output signals $O_1$ and $O_2$. Then, the first set signal $P_1$ will set the flipflop D100 to the initial condition and make the output of the NAND gate N102 high level and that of the NAND gate N103 low level, thereby generating an alert tone from the NAND gate N103.

This type of memory circuit, however, cannot be used with a radio paging system in which each pager is provided with more than two address codewords, e.g. one disclosed in the report "A standard Code for Radiopaging" presented by the British Post Office in July 1979, at pages 1 to page 40.

Hereinafter will be described a radio paging receiver embodying the present invention which will be the solution to the problem discussed above.

Figure 2A:
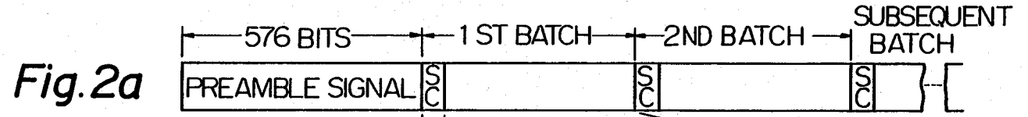
FIGS. 2a-2d are diagrams showing an example of a signal which a radio paging receiver may receive.
Figure 2B:
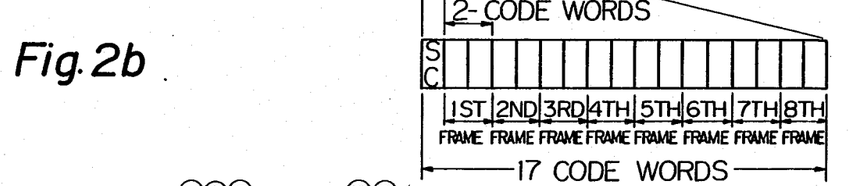
Figures 2C, 2D:
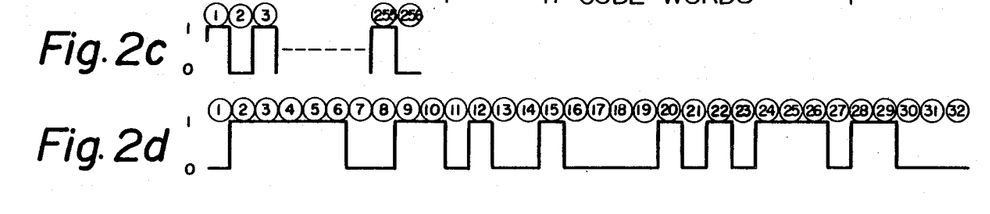
Figure 3A:
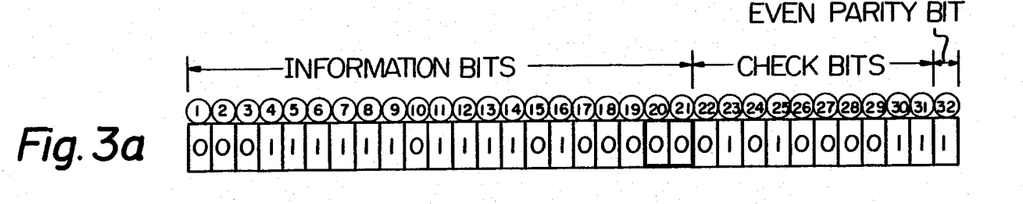
FIGS. 3a-3d are diagrams of address code formats.
Figures 3B, 3C, 3D:
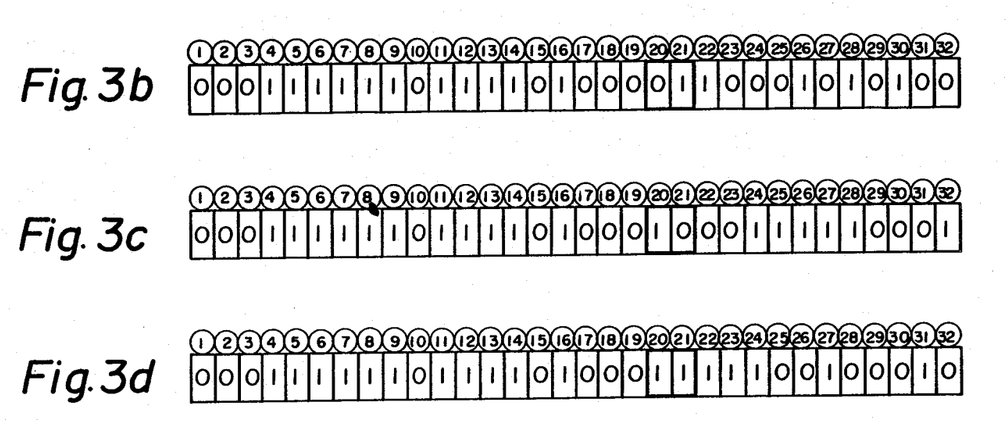

Referring to FIGS. 2a–2d, there is shown an example of signals which may be transmitted from the base station of a radio paging system. The signal shown in FIG. 2a contains a 576-bit preamble signal and, following it, a plurality of 17-codeword batches. Each batch further includes a synchronizing codeword (SC) signal and, following it, eight two-codeword frames, as shown in FIG. 2b. FIG. 2c illustrates the preamble signal, consisting of repetition of "1" and "0". FIG. 2d shows an example of SC signals. Each frame in each batch comprises one or another of the address codewords shown in FIGS. 3a–3d.

Figure 4:
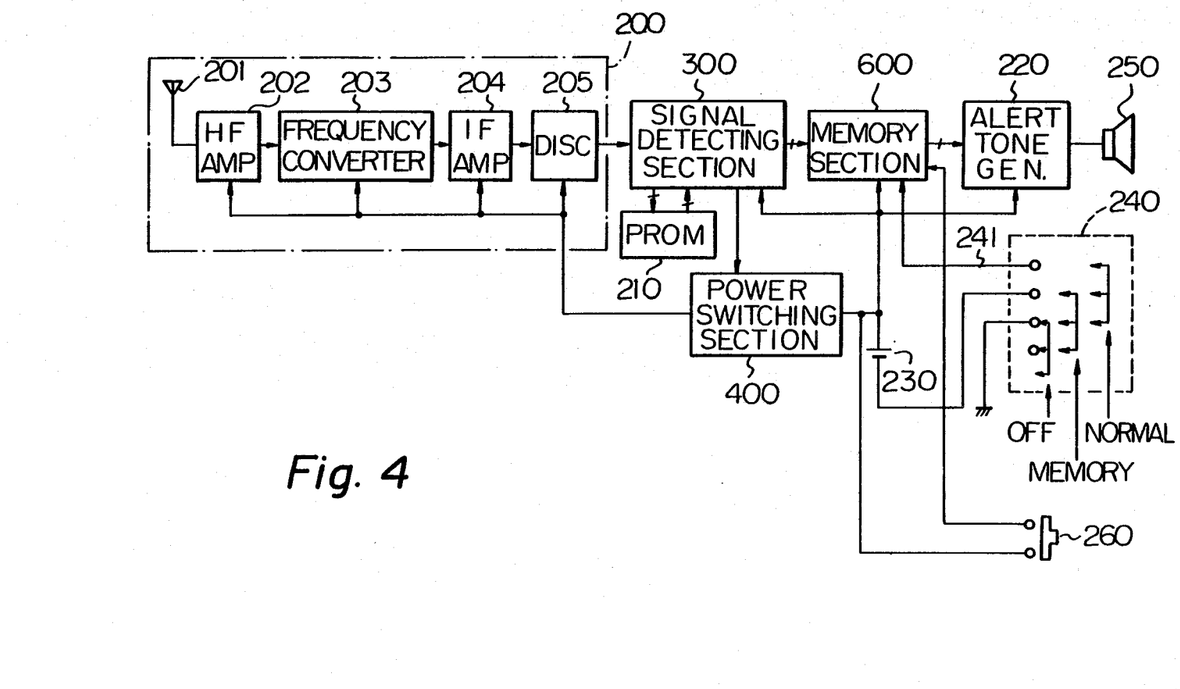
FIG. 4 is a block diagram of a radio paging receiver embodying the present invention.

With reference to FIG. 4, an antenna 201 picks up a carrier wave which is frequency-shift-keying modulated with the selective calling signal shown in FIG. 2a, and supplies it to a high-frequency amplifier 202 for preamplification. The amplified signal is frequency-converted into an intermediate frequency (IF) signal by a frequency converter 203 including a mixer and a local oscillator. A discriminator 205 demodulates the IF signal from the converter 203, amplified by an IF amplifier 204, into a digital signal. These circuits are well known ones in the art, and collectively called a receiving section 200 herein. The receiving section 200, when waiting for a call, is intermittently supplied for the battery saving function with electric power from a battery 230 by way of a power switching section 400.

The demodulated digital signal is supplied to a signal detecting section 300. If a preamble signal is detected therein, the power switching section 400 will be driven for a predetermined duration required for SC signal detection, during which power is supplied from the battery 230 to the receiving section 200. Thus, the battery saving function is temporarily suspended. If an SC signal is detected by the detecting section 300 in that while, the battery saving function is further kept suspended. Next, if a slide switch 240 is in a MEMORY position, the selective calling signal is compared with assigned address codewords which are stored in a PROM 210. If they are found identical with each other, a memory section 600 stores the detected selective calling signal. Every time a selective calling signal is transmitted from the base station and the receiver detects it in the manner described, the memory section 600 stores detected calling signals in the order of detection, one of which the PROM 210 stores and the others the detecting section 300 produces from the codeword stored in the PROM 210. When the switch 240 is shifted to its NORMAL position, one out of all the detected signals stored in the memory section 600 is fed to an alert tone generator 220 in the first-in-first-out order. This will drive the alert tone generator 220 to emit an alert tone through a loudspeaker 250. Next, when a switch 260 is turned on and then off, an output signal of the memory section 600 corresponding to the next detected signal is fed to the alert tone generator 220 to generate a second alert tone in the same manner as the first. As will now be seen, each time the switch 260 is depressed, a drive signal is applied from the memory section 600 to the alert tone generator 220 so that alert tones are emitted one after another until the memory section 600 becomes empty. If the signal detecting section 300 fails to detect an SC signal ("no" is detected twice in this particular example), the power switching section 400 will resume its battery saving action to intermittently supply power to the receiving section 200.

In principle, the receiving section 200, signal detecting section 300, PROM 210 and power switching section 400 may be constructed using the circuitry which is disclosed in Japanese Patent Application No. 57-12400/82 entitled "DIGITAL RADIO PAGING RECEIVER".

Figure 5:
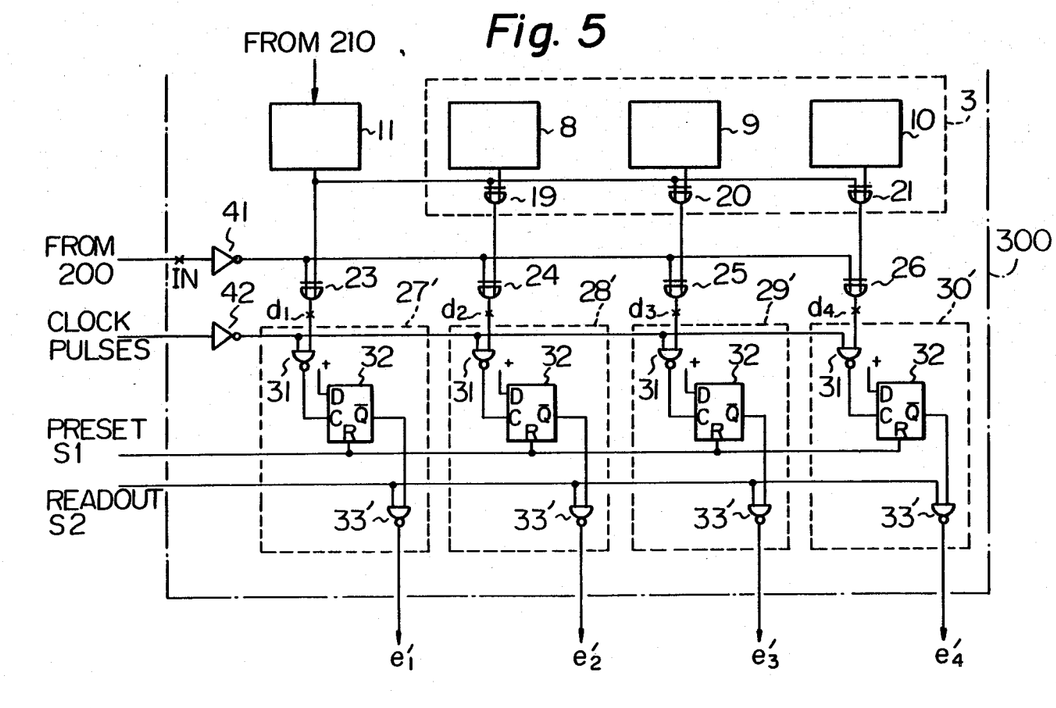
FIG. 5 is a circuit diagram of a signal detecting section included in the receiver of FIG. 4.

Referring to FIG. 5, an address code detector applicable to this embodiment is shown and generally designated by the reference numeral 300. The address code detector 300 is essentially similar to that shown in the above-mentioned Japanese Patent Application exept for the use of detect circuits 27'–30', each of which is adapted to generate a detect pulse and constructed by modifying the latching circuit of the precedent address code detector to omit its latching function. Upon reception of four different kinds of calls on line 200, output pulses will appear on the four output line $e_1$–$e_4$, independent of each other.

Figure 6:
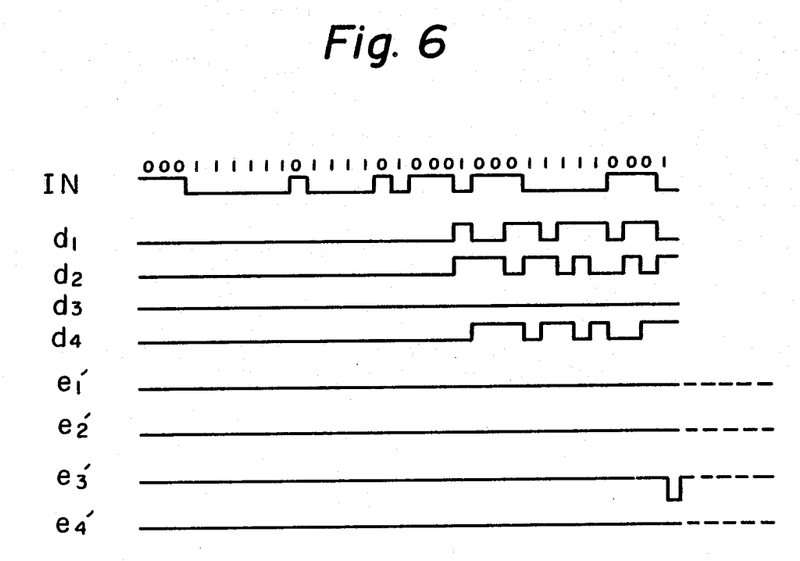
FIG. 6 is a timing chart showing signals which will appear in various portions of the circuit of FIG. 5.

Referring also to FIG. 6, the input signal IN from the receiving section 200 is compared with output signals of readout circuits 8–11 and the results $d_1$, $d_2$, $d_3$ and $d_4$ of the comparison are individually supplied to outputs of exclusive OR circuits 23 to 26 and, therethrough, to the detect circuits 27'–30' each of which comprises a two-input NAND gate 31, a D-type flipflop 32 and a two-input NAND gate 33'. The detect circuits 27' to 30' individually receive reset and readout pulses $S_1$ and $S_2$ which are produced from a readout pulse generator which is, for example, disclosed in the above-mentioned Japanese Patent Application. Supposing the input signal IN is identical with the output of the readout circuit 9, a corresponding detected signal appears as indicated by $e_3'$ in FIG. 6. This detected signal is fed to the following memory section 600. While the slide switch 240 is in the MEMORY position (which may be selected by the user to, for example, reject calls by the alert tone during meeting), the memory section 600 will store detected signals supplied from the signal detecting section 300 sequentially in the order of the receipt. When the switch 240 is shifted from the MEMORY position to the NORMAL position (as may be selected to see whether or not any call was received after the meeting or when the use of the pager for the memory function is needless), the memory section 600 will deliver the content thereof in the first-in-first-out order. Such a function of the memory section 600 will be described in detail with reference to the drawings.

Figure 7:
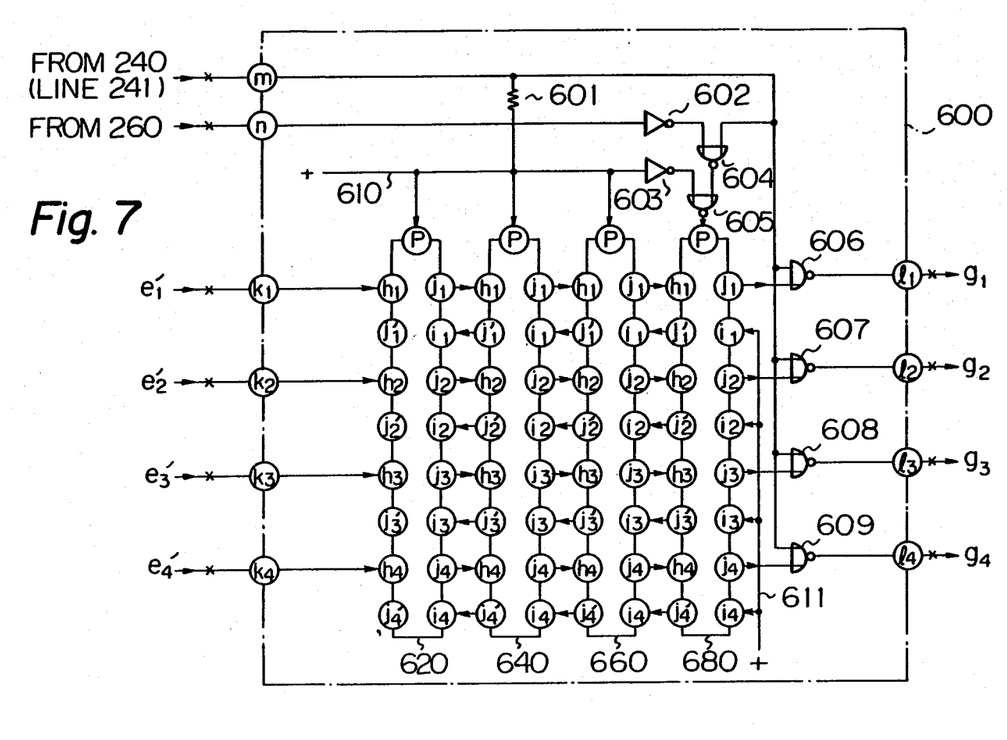
FIG. 7 shows a more specific construction of the whole memory device used in the present invention.

As shown in FIG. 7, the memory section 600 comprises four input terminals $k_1-k_4$, output terminals $l_1-l_4$ respectively associated with the input terminals $k_1-k_4$, and terminals m and n for outputting stored information. An input terminal m is provided for the control of read gates (606 to 609). When the terminal m is at a high level, readout is inhibited; when it is at a low level, an output appears on any one of $g_1$, $g_2$, $g_3$ and $g_4$. The terminal m also serves as an input terminal of a reset pulse to input inhibit gate 604 so that only when it is at a low level, an input (reset pulse) to the switch 260 appears on the output of the gate 604. When the data stored in the respective memory cells in the memory circuit 680 are cleared (i.e. when the circuit 680 is emptied) in response to an output (negative pulse) from NOR gate 605, the data in the memory circuit 660 is shifted to the memory circuit 680, the data in the memory circuit 640 to the memory circuit 660, and the data in the memory circuit 620 to the memory circuit 640.

Figure 8:
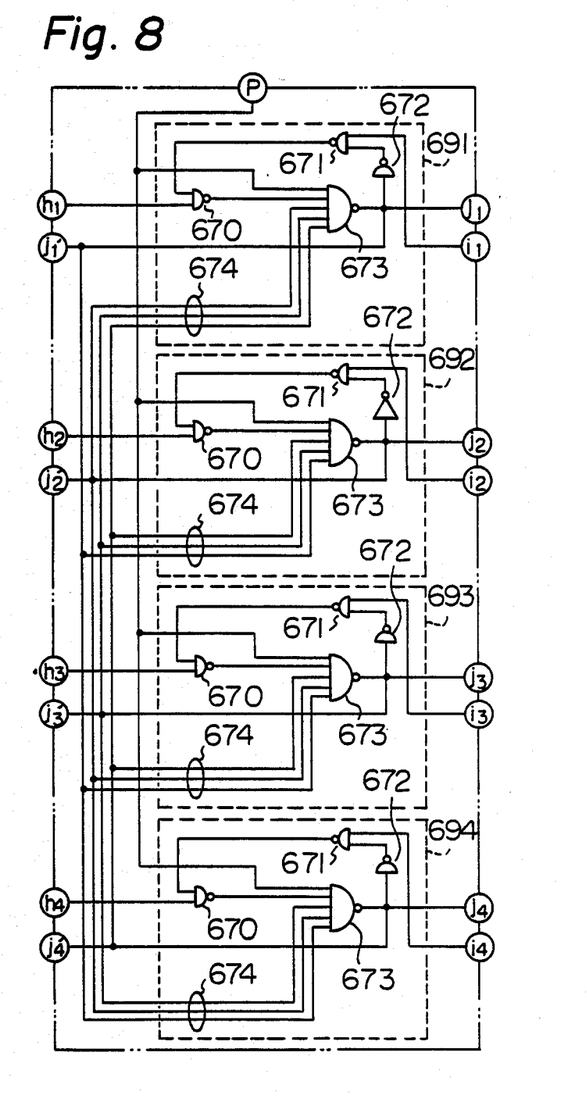
FIG. 8 is a diagram of a memory circuit included in the memory section.

Major components of the memory section 600 are four memory circuits 620, 640, 660 and 680. Each of these memory circuits 620–680 comprises four memory cells 691–694 as illustrated in FIG. 8. Each memory cell comprises a terminal P, input terminals h, output terminals j and j′ three input inhibit lines 674 and a data hold terminal i. The functions allocated to each memory cell, therefore, are to receive and deliver detected signals, to inhibit inputs and to hold data. Connection lines 610 and 611 are connected to the positive terminal of the battery 230.

It will be noted in FIG. 8 that numerals are suffixed to the terminals h, j, j′ and i to facilitate discrimination between the four memory cells.

In operation, each memory cell in the initial condition is high level at the terminal P, data hold terminal i and input terminal h and, thereby, at the output terminals j and j′ and input inhibit line 674. When a low level of such a detected signal as the signal $e_3'$ of FIG. 6 arrives at the input terminal h, a two-input NAND gate 670 delivers a high level output, a five-input NAND gate 673 delivers a low level output j (j′), and inverter 672 delivers a high level output, and a two-input NAND gate 671 delivers a low level output, whereby the high level output of the nand gate 670 is latched, that is, the output terminals j and j′ are held at the low level. As shown, the output of the memory cell 691 is connected to the input inhibit lines 674 of the other memory cells 692, 693 and 694, the output of the memory cell 692 to those of the memory cells 691, 693 and 694, and the output of the memory cell 694 to those of the memory cells 691, 692 and 693. Hence, upon entry of a detected signal into any one of the memory cells 691–694, the input inhibit lines 674 of the other three memory cells become low level to set up an input inhibit state. The latched memory cell will be reset by making the associated reset terminal P low level. Thus, the construction of each memory circuit is such that upon arrival of a detected signal at any one of the input terminals $h_1-h_4$, it holds the input signal while rejecting detected signals which may follow the first.

As seen in FIG. 7, each memory circuit has the output terminals j connecting to the input terminals h of the subsequent stage memory circuit, while the subsequent stage memory circuit has the output terminals j′ connecting to the data hold terminals i of the preceding stage memory circuit, as viewed from the left (input side) to right (output side) in the drawing. The data hold terminal i of each memory cell has a function of holding data being stored in the preceding memory cell when the subsequent memory cell is empty (i.e. when i is at a high level) and not holding it when the subsequent memory cell is full (i.e. when i is at a low level). In this construction, a detected signal reached an input terminal k will be sequentially shifted from the memory circuit 620 to the memory circuit 680 via the memory circuits 640 and 660 in sequence. Upon the shift of the detected signal to the final memory circuit 680, the other memory circuits 620, 640 and 660 will become empty to prepare for the storage of subsequent detected signals.

Figure 9:
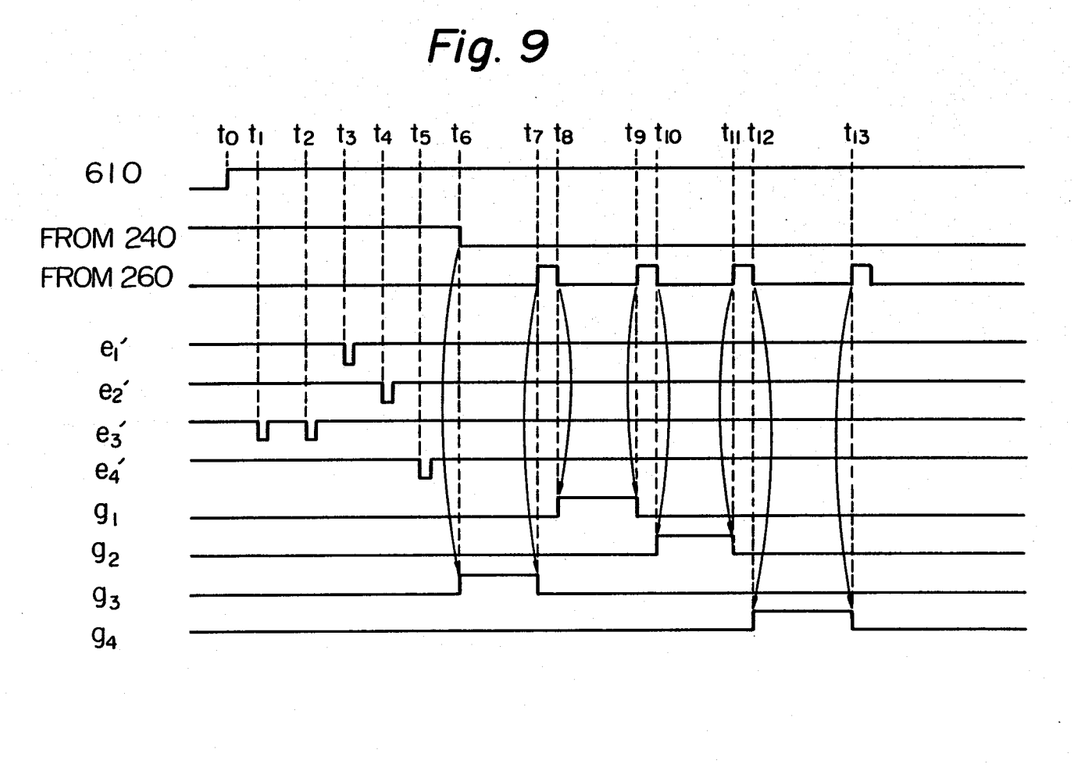
FIG. 9 is a timing chart demonstrating the operation of the memory circuit.

The operation of the circuitry of FIG. 7 is demonstrated in timing chart in FIG. 9. At a time $t_0$, the receiver is turned on and the slide switch 240 is manipulated to the MEMORY position. Supposing the detected signal $e_3'$ has arrived at the memory section 600 at a time $t_1$, the memory circuit 680 stores it therein as previously discussed. If another detected signal $e_3'$ is supplied at a time $t_2$, the memory cell of the memory circuit 660 having the data hold terminal $i_3$ will not be latched due to the low level of the terminal $i_3$ and, therefore, it will not hold the input signal. That is, upon successive entry of common address codewords (i.e. the same address code continuously received and detected), the memory circuits will not store them except for the first one. This enhances the efficiency of the memory circuits. Next, in response to a detected signal $e_1'$ supplied at a time $t_3$, the output terminal $j_1$ of the memory circuit 660 becomes low level; in response to a detected signal $e_2'$ supplied at a time $t_4$, the output terminal $j_2$ of the memory circuit 640 becomes low level; and in response to a detected signal $e_4'$ supplied at a time $t_5$, the output terminal $j_4$ of the memory circuit 620 becomes low level. In this manner, the memory section 600 sequentially stores detected signals in the sequence of the supply.

As soon as the slide switch 240 is shifted to the NORMAL position at a time $t_6$, the memory section 600 supplies the output terminal $l_3$ with a signal $g_3$ up to a time $t_7$ at which the switch 260 is turned on. This is because the shift of the switch 240 to the NORMAL position makes one input of each two-input NOR gate 604 or 606 low level and because the switch 260 is turned on (high level). So long as the switch 260 is on, an inverter 602 inverts its input and the two-input NOR gate 604 is made high level and the two-input NOR gate 605 low level. Then, the terminal P of the memory circuit 680 becomes low level to unlatch the memory cells therein. As soon as the switch 260 is turned off as at a time $t_8$, the output of the inverter 602 inverts the states of the NOR gates 604 and 605 so that the information stored in the memory circuits 620, 640 and 660 is sequentially shifted toward the output side until an output $g_1$ appears at the output terminal $l_1$. Every time the switch 260 is turned on and off in the manner described as at the times $t_9-t_{13}$, outputs $g_2$ and $g_4$ respectively appear at the output terminals $l_2$ and $l_4$ as shown in FIG. 9. The alert tone generator 220 has four oscillators which will be individually energized by the signals $g_1$–$g_4$ to in turn drive the loudspeaker 250.

In summary, it will be seen that the present invention provides a radio paging receiver in which a memory section comprises the combination of flipflops and shift registers, enabling the receiver to sequentially output detected signals in the order of receipt thereof. The memory device of the present invention is realized by arranging "n"×"x" memory cells in "n" rows and "x" columns such that they constitute shift registers in the direction of rows and flip-flops in the direction of columns. The flip-flop allow only one data to be stored in one column of memory cells. Data stored in the respective columns are fed from input terminals toward output terminals to be outputted in the sequence of entry.

In a memory device in which signals inputted via n input terminals independently of each other are sequentially outputted from n output terminals which are associated one-to-one with the input terminals, the present invention is characterized in that it includes memory portions each having n input terminals, n output terminals and n data hold terminals adapted to hold data as cascaded in x stages, in that each output terminal of the preceding stage is interconnected to the input terminals of the subsequent stage and the output terminal of the subsequent stage is interconnected to the data hold terminal of the preceding stage so as to provide means for transferring data being stored in the preceding stage to the succeeding stage, and in that the memory portion at each stage holds data being stored in the memory portion of the preceding stage when the memory portion at the subsequent stage is empty and, on the other hand, transfers and outputs the data without holding it when the memory portion of the subsequent stage is full. Especially, the present invention facilitates production of a pager having three or more selective calling numbers at a practical cost.

Various modifications will become possible for those skilled in the art after receiving the teachings of the present disclosure without departing from the scope thereof.

What is claimed is:

1. A memory device for a radio paging receiver which has n (integer not smaller than 2) input terminals and n output terminals individually corresponding to the input terminals and delivers input signals supplied to the input terminals sequentially from the output terminals, said memory device comprising:

memory means including x (integer not smaller than 2) memory portions which are cascaded in x stages, each of said memory portions having n input terminals, n output terminals and n data hold terminals in one-to-one correspondence, the output terminals of any of said stages being connected to the input terminals of the subsequent stage and the output terminals of said subsequent stage being connected to the data hold terminals of said preceding stage; and control means for controlling said memory means such that data is so transferred and output as to cause data in said preceding stage to be held when said subsequent stage is empty and to prevent the data in the preceding stage from being held when the subsequent stage is full.

2. The memory device as claimed in claim 1, in which each of the memory portions comprises n memory cells each of which has an input terminal, an output terminal, a data hold terminal and an input inhibit terminal, the output terminal of each of the memory cells being connected to the input inhibit terminals of the other (n−1) memory cells, the control means being constructed to control the memory cells such that upon entry of an input signal into any one of the n memory cells, entry of input signals into the other (n−1) memory cells is inhibited, specific one of the memory cells which stores the first signal of all the signals individually input through the n input terminals being maintained full with the entry of the second to the last signals inhibited, whereby the other (n−1) memory cells are emptied.

3. The memory device as claimed in claim 1, further comprising a switch, having an input adapted to receive outside request signals and having an output connected to said control means, and in which the control means is constructed to control the memory means such that delivery of information from the n output terminals is prevented until a request signal is provided from said switch.

* * * * *